(12) United States Patent
Teng

(10) Patent No.: US 9,893,700 B2
(45) Date of Patent: Feb. 13, 2018

(54) LOCAL AREA NETWORK FILTERING CIRCUIT

(71) Applicant: DELTA ELECTRONICS, INC., Taoyuan County (TW)

(72) Inventor: Chi-Huan Teng, Taoyuan County (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 170 days.

(21) Appl. No.: 14/918,822

(22) Filed: Oct. 21, 2015

(65) Prior Publication Data

US 2016/0352301 A1    Dec. 1, 2016

(30) Foreign Application Priority Data

May 29, 2015  (TW) .............................. 104117310 A

(51) Int. Cl.

| H03H 1/00 | (2006.01) |
| H01F 27/29 | (2006.01) |
| H01F 38/14 | (2006.01) |
| H01F 27/24 | (2006.01) |
| H03H 7/42 | (2006.01) |

(52) U.S. Cl.
CPC ........... H03H 1/0007 (2013.01); H01F 27/24 (2013.01); H01F 27/29 (2013.01); H01F 38/14 (2013.01); H03H 7/427 (2013.01); H01F 2038/143 (2013.01)

(58) Field of Classification Search
CPC ........... H03H 2001/0085; H03H 7/427; H03H 1/0007; H01F 27/24; H01F 38/14; H01F 2038/143

USPC .......................................................... 333/177
See application file for complete search history.

(56) References Cited

U.S. PATENT DOCUMENTS

| 7,701,092 B1* | 4/2010 | Parker ..................... H04L 12/10 307/154 |
| 8,333,599 B2 | 12/2012 | Xu et al. |
| 2004/0239465 A1* | 12/2004 | Chen ....................... H01F 17/00 336/173 |
| 2005/0243483 A1* | 11/2005 | Chen ..................... H02H 9/005 361/38 |

(Continued)

OTHER PUBLICATIONS

Office Action dated Apr. 18, 2016 from corresponding application No. TW 104117310.

*Primary Examiner* — Benny Lee
*Assistant Examiner* — Hafizur Rahman
(74) *Attorney, Agent, or Firm* — Hauptman Ham, LLP

(57) ABSTRACT

A LAN filtering circuit is discloses. The LAN filtering circuit includes an isolation transformer and a common-mode chock. The isolation transformer includes a first winding and a second winding coupling to each other. The first winding has a first tap, a second tap, and a center tap. A distance between the first tap and the second tap is not only larger than a distance between the first tap and the center tap but also larger than a distance between the second tap and the center tap. The common-mode chock includes a first input port, a second input port, and an input port arranged in a sequence order, the first tap is electrically connected to the first input port, the second tap is electrically connected to the second input port, and the center tap is electrically connected to the input port.

8 Claims, 2 Drawing Sheets

(56) References Cited

U.S. PATENT DOCUMENTS

2011/0304411 A1* 12/2011 Zhang ................. H01R 23/688
                                                    333/177
2014/0170904 A1    6/2014 Tang et al.

* cited by examiner

LOCAL AREA NETWORK FILTERING CIRCUIT

BACKGROUND OF THE INVENTION

Field of the Invention

The present disclosure relates to a filtering circuit. More particularly, the present disclosure relates to a local area network (LAN) filtering circuit.

Description of Related Art

Common-mode choke (CMC) is typically used in switch power supply to reject unwanted common-mode signals (or called common mode noise) and thus electromagnetic emission generated by high frequency signal can be effectively suppressed. In fact, the common-mode choke is a bilateral filter, which not only rejects common-mode noise and signal but also suppresses electromagnetic emission from radiating into the environment to avoid affecting the other electronic products in the same electromagnetic environment.

Reference is made to FIG. 1, which shows a circuit diagram of a local area network (LAN) filtering circuit. The LAN filtering circuit includes a cable side 3 and a physical side 4, the cable side 3 is connected to a cable assembly, and the physical side 4 is connected to an external circuit board.

The LAN filtering circuit sandwiched between the cable side 3 and the physical side 4 includes a common-mode choke (CMC) 1 and an isolating transformer 2. The common-mode choke 1 shown in FIG. 1 is a 3-wire common mode choke. The common-mode choke 1 includes two opposite ends, wherein one end thereof includes a first input port 100, a second input port 120, and an input port 140 arranged in a sequential order, and the other end thereof includes a first output port 102, the second output port 122, and an output port 142 arranged in a sequential order.

The common-mode choke 1 further includes a first coil 10, a second coil 12, and a third coil 14. One terminal of the first coil 10 is electrically connected to the first input port 100, and the other terminal thereof is electrically connected to the first output port 102. One terminal of the second coil 12 is electrically connected to the second input port 120, and the other terminal thereof is electrically connected to the second output port 122. One terminal of the third coil 14 is electrically connected to the input port 140, and the other terminal thereof is electrically connected to the output port 142.

The isolating transformer 2 includes a first winding 20 and a second winding 22 coupling to each other. The first winding 20 has a first tap 202, a second tap 204, and a center tap 206. A distance between the first tap 202 and the second tap 204 is not only larger than a distance between the first tap 202 and the center tap 206 but also larger than a distance between second tap 204 and the center tap 206. The first tap 202 is connected to the first input port 100, the second tap 204 is connected to the input port 140, and the center tap 206 is connected to the second input port 120.

The second winding 22 includes a first tap 222, a second tap 224, and a center tap 226, wherein polarities of the first tap 222, the second tap 224, and the center tap 226 of the second winding 22 are the same as polarities of the first tap 202, the second tap 204, and the center tap 206 of the first winding 20. The first tap 222 of the second winding 22 is electrically connected to a high-level power rail (as symbol "+" shown in FIG. 1), the second tap 224 thereof is electrically connected to a low-level power rail (as symbol "−" shown in FIG. 1), and the center tap 226 thereof is electrically connected to a reference-level power rail (such as ground, and as symbol "G" shown in FIG. 1).

However, the connection manner of the common-mode choke 1 and the isolation transformer 2 shown in FIG. 1 makes a distance d1 (as shown in FIG. 2) between power rails for transmitting high-level signal (the first winding 10) and low-level signal (the third winding 14) is the largest distance between every two of the first winding 10, the second winding 12, and the third winding 14. Thus, the coupling coefficient of the local area network filtering circuit is poor, and a capability for resisting external noise is weak.

Hence, an improved local area network filtering circuit is required to overcome the above-mentioned disadvantages of the related art.

SUMMARY OF THE INVENTION

According to one aspect of the present disclosure, the local area network filtering circuit sandwiched between a physical side and a cable side of a local area network includes an isolating transformer and a common-mode choke. The isolation transformer includes a first winding and a second winding, the first winding has a first tap, a second tap, and a center tap, wherein a distance between the first tap and the second tap is not only larger than a distance between the first tap and the center tap but also larger than a distance between the first tap and the second tap. The common-mode choke includes two opposite ends, and one end of the common-mode choke has a first input port, a second input port, and an input port arranged in a sequential order, wherein the first tap is electrically connected to the first input port, the second tap is electrically connected to the second input port, and the center tap is electrically connected to the input port.

According to another aspect of the present disclosure, the local area network filtering network sandwiched between a cable side and a physical side of a local area network includes an isolating transformer and a common-mode choke. The isolating transformer has a first tap, a second tap, and a center tap, wherein a distance between the first tap and the second tap is not only larger than a distance between the first tap and the center tap but also larger than a distance between the second tap and the center tap. The common-mode choke includes two opposite ends, and one end of the common-mode choke has a first input port, a second input port, and an input port arranged in a sequence order. At least one of distances between the first input port and the input port and the second input port and the input port is larger than a distance between the first input port and the second input port. The first tap is electrically connected to the first input port, the second tap is electrically connected to the second input port, and the center tap is electrically connected to the input port.

The local area network filtering circuit of the present invention not only filters the common-mode noise but also enhances coupling coefficient between high-level power rail and low-level rail, thus the capability for resisting external noise can be enhanced.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

The local area network filtering circuit of the present disclosure is not only used for filtering common-mode noise (or signal) but also increases the coupling coefficient of difference-mode signal to enhance the capability for resisting external noise.

Figure 1:
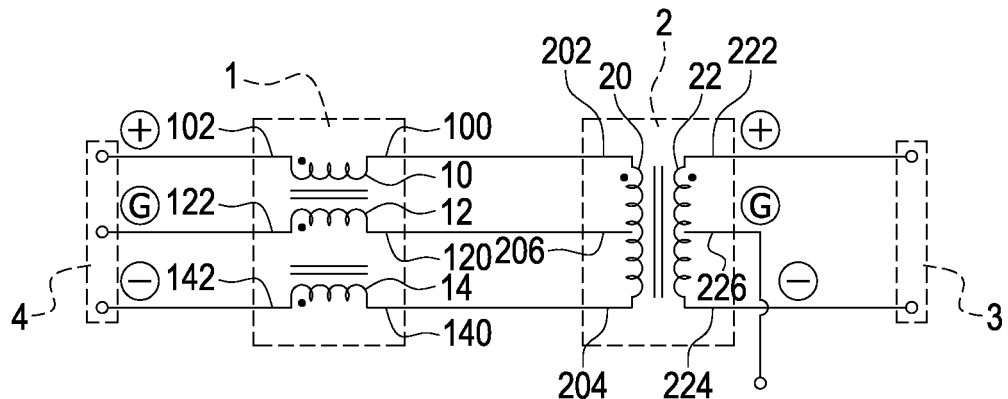
FIG. 1 is a circuit diagram of a conventional local area network filtering circuit.
Figure 2:
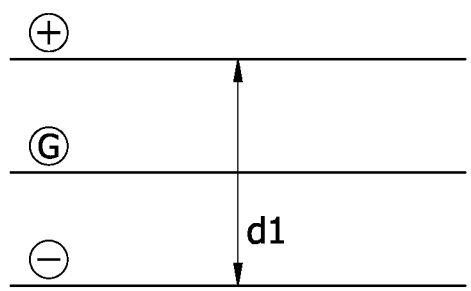
FIG. 2 is a graph shows signal-coupling relationship of the local area circuit filtering circuit shown in FIG. 1.
Figure 3:
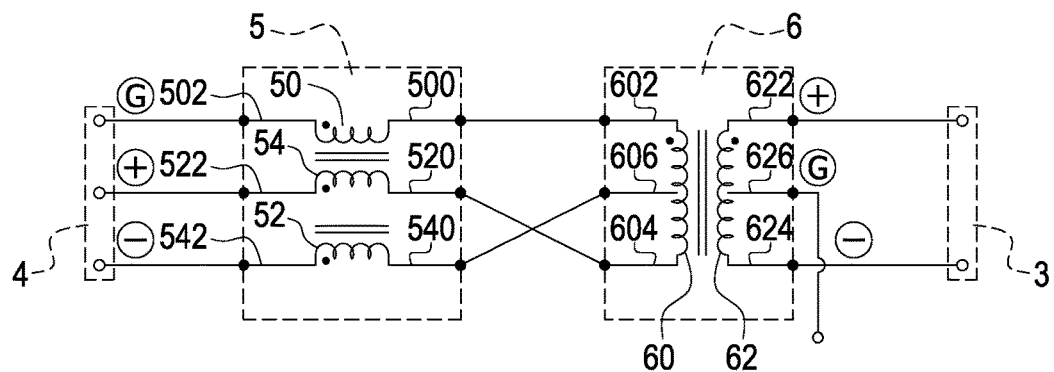
FIG. 3 is a circuit diagram of a local area network filtering circuit of the present disclosure.

Reference is made to FIG. 3, which is a circuit diagram of a local area network filtering circuit according to the present disclosure. The local area network filtering circuit is applied to a local area network having a cable side 3 and a physical side 4. The cable side 3 of the local area network is used for connecting to cable assembly, and the physical side 4 thereof is used for connecting to an external circuit board. The local area network filtering circuit includes a common-mode choke 5 and an isolating transformer 6 sandwiched between the cable side 3 and the physical side 4.

Figure 5:
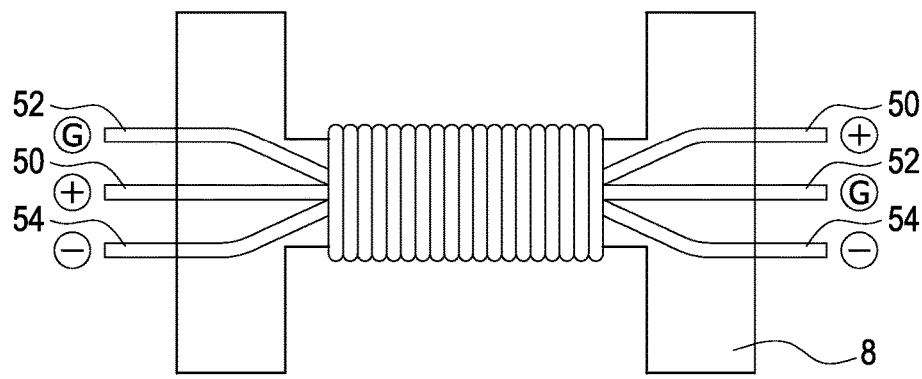
FIG. 5 is a schematic view of common-mode choke of the local area network filtering circuit.

The common-mode choke 5 is a 3-wire common-mode choke k to reject unwanted common-mode electromagnetic interference signals (or called common-mode noise). The common-mode choke 5 includes two opposite ends, one end thereof has a first input port 500, a second input port 520, and an input port 540 arranged in a sequence order, and the other end thereof has a first output port 502, a second output port 522, and an output port 542 in a sequence order as shown in FIG. 3. The first output port 502 is electrically connected to the first input port 500, the second output port 522 is electrically connected to the second input port 520, and the output port 542 is electrically connected to the input port 540. More particular, at least one of distances between the first input port 500 and the input port 540 and the second input port 520 and the input port 540 is larger a distance between the first input port 500 and the second input port 520, Reference is made to FIG. 5, the common-mode choke 5 further includes a first coil 50, a second coil 52, a third coil 54, and an I-shaped magnetic core 8. The first coil 50 has two opposite terminals, one terminal of the first coil 50 is electrically connected to the first input port 500, and the other terminal thereof is electrically connected to the first output port 502. The second coil 52 includes two opposite terminals, one terminal of the second coil 52 is electrically connected to the second input port 520, and the other terminal thereof is electrically connected to the second output port 522. The third coil 54 includes two opposite terminals, one terminal of the third coil 54 is electrically connected to the input port 540, and the other terminal thereof is electrically connected to the output port 542.

The first coil 50, the second coil 52, and the third coil 54 are wound around the I-shaped magnetic core 8 and along a major axis of the I-shaped magnetic core 8. The first input port 500, the second input port 520, and the input port 540 are arranged on a front end along the major axis of the I-shape magnetic core 8 in a sequence order, and the first output port 502, the second output port 522, and the output port 542 are arranged on a rear end along the major axis of the I-shape magnetic core 8 in a sequence order.

The isolating transformer 6 includes a first winding 60 and a second winding 62 coupling to each other. The first winding 60 includes a first tap 602, a second tap 604, and a center tap 606. A distance between the first tap 602 and the second tap 604 is not only larger than a distance between the first tap 602 and the center tap 606 but also a distance between the second tap 604 and the center tap 606. In the other words, the center tap 606 is arranged between the first tap 602 and the second tap 604.

The first tap 602 is electrically connected to the first input port 500, the second tap 604 is electrically connected to the second input port 520, and the center tap 606 is electrically connected to the input port 540.

The second winding 62 includes a first tap 622, a second tap 624, and a center tap 626, a distance between the first tap 622 and the second tap 624 is not only larger than a distance between the first tap 622 and the center tap 606 but also a distance between the second tap 624 and the center tap 626. In the other word, the center tap 626 of the second winding 62 is sandwiched between the first tap 622 and the second tap 624.

Polarities of the first tap 602, the second tap 604, and the center tap 606 of the first winding 60 are respectively the same as the first tap 622, the second tap 624, and the center tap 626 of the second winding 62. Thus, when the first tap 622, the second tap 624, and the center tap 626 of the second winding 62 are electrically connected to a high-level power rail (as symbol "+" shown in FIG. 3), a low-level power rail (as symbol "−" shown in FIG. 3), and a reference-level power rail (as symbol "G" shown in FIG. 3), respectively, a high-level signal, a low-level signal, and a reference-level signal is conducted within the first tap 602, the second tap 604, and the center tap 606 of the first winding 60 by electromagnetic induction.

Figure 4:
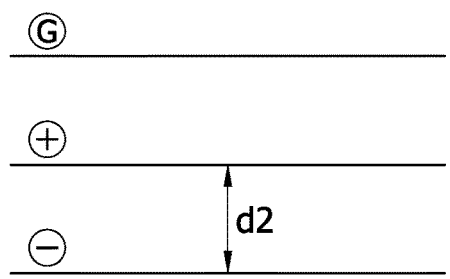
FIG. 4 is a graph shows signal-coupling relationship of the local area network filtering circuit shown in FIG. 3.

The local area network filtering circuit of the present invention modifies the connecting manner between the common-mode choke 5 and the first winding 60 of the isolating transformer 6 to change the coupling distance d2 (as shown in FIG. 4) between the high-level signal and the low-level signal, thus the coupling coefficient of different-mode signal is decreased, and the signal transmission quality is then improved, wherein the high-level signal and the low-level signal transmitted from the cable side 3 is transmitted to the first tap 622 and the second tap 624 arranged at two opposite sides of the center tap 626, and then transmitted to the first output port 502 and the second output port 522 that are adjacent to each other.

To sum up, the local area network filtering circuit of the present invention can effectively enhance coupling coefficient between high-level power rail and low-level rail, thus the capability for resisting external noise is then enhanced.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A local area network filtering circuit sandwiched between a physical side and a cable side of a local area network comprising:

an isolation transformer comprising a first winding and a second winding, the first winding having a first tap, a second tap, and a center tap, wherein a distance between the first tap and the second tap is not only larger than a distance between the first tap and the center tap but also larger than a distance between the center tap and the second tap; and a common-mode choke comprising two opposite ends, one end of the common-mode choke having a first input port, a second input port, and an input port arranged in a-sequential order, wherein the first tap is electrically connected to the first input port, the second tap is electrically connected to the second input port, and the center tap is electrically connected to the input port, wherein the other end of the common-mode choke comprising a first output port, a second output port, and an output port arranged in a-sequential order, the first output port is electrically connected to the first input port, the second output port is electrically connected to the second input port, and the output port is electrically connected to the input port.

2. The local area network filtering circuit in claim 1, wherein the common-mode choke further comprises a first coil, a second coil, and a third coil, two opposite terminals of the first coil are electrically connected to the first input port and the first output port, two opposite terminals of the second coil are electrically connected to the second input port and the second output port, and two opposite terminals of the third coil are electrically connected to the input port and the output port.

3. The local area network filtering circuit in claim 1, wherein the common-mode choke further comprising an I-shaped magnetic core, the first input port, the second input port, and the input port are arranged on a front end along a major axis of the I-shaped magnetic core in a sequential order.

4. The local area network filtering circuit in claim 3, wherein the first output port, the second output port, and the output port are arranged on a rear end along the major axis of the I-shaped magnetic core in a sequential order.

5. A local area network filtering circuit sandwiched between a physical side and a cable side of a local area network comprising:

an isolating transformer comprising a first winding and a second winding coupling to each other, the first winding having a first tap, a second tap, and a center tap, wherein a distance between the first tap and the second tap is not only larger than a distance between the first tap and the center tap but also larger than a distance between the second tap and the center tap; and a common-mode choke comprising two opposite ends, one end of the common-mode choke having a first input port, a second input port, and an input port arranged in a sequential order, wherein at least one of distances between the first input port and the input port and the second input port and the input port is larger than a distance between the first input port and the second input port, wherein the first tap is electrically connected to the first input port, the second tap is electrically connected to the second input port, and the center tap is electrically connected to the input port, and wherein the other end of the common-mode choke has a first output port, a second output port, and an output port arranged in a sequential order, the first output port is electrically connected to the first input port, the second output port is electrically connected to the second input port, and the output port is electrically connected to the input port.

6. The local area network filtering circuit in claim 5, wherein the common-mode choke further comprising an I-shaped magnetic core, the first input port, the second input port, and the input port are arranged on a front end along a major axis of the I-shaped magnetic core in a sequential order.

7. The local area network filtering circuit in claim 5, wherein the common-mode choke comprising a first coil, a second coil, and a third coil, two opposite terminals of the first coil are electrically connected to the first input port and the first output port, two opposite terminals of the second coil are electrically connected to the second input port and the second output port, and two opposite terminals of the third coil are electrically connected to the input port and the output port.

8. The local area network filtering circuit in claim 6, wherein the first output port, the second output port, and the output port are arranged on a rear end along the major axis of the common-mode choke in sequential order.

\* \* \* \* \*